United States Patent
Abasahl et al.

(10) Patent No.: US 11,322,911 B2
(45) Date of Patent: May 3, 2022

(54) DEVICE AND METHOD FOR EMITTING ELECTROMAGNETIC RADIATION

(71) Applicant: Infineon Technologies AG, Neubiberg (DE)

(72) Inventors: Banafsheh Abasahl, Münster (DE);
Cristina Consani, Villach (AT);
Thomas Grille, Villach (AT);
Bernhard Jakoby, Linz (AT);
Reyhaneh Jannesari, Plesching (AT);
Andreas Tortschanoff, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 98 days.

(21) Appl. No.: 16/797,522

(22) Filed: Feb. 21, 2020

(65) Prior Publication Data
US 2020/0313396 A1    Oct. 1, 2020

(30) Foreign Application Priority Data

Mar. 27, 2019   (EP) ..................................... 19165621

(51) Int. Cl.
*H01S 5/22* (2006.01)
*G01N 21/3504* (2014.01)
*G01N 29/22* (2006.01)

(52) U.S. Cl.
CPC .......... *H01S 5/22* (2013.01); *G01N 21/3504* (2013.01); *G01N 29/22* (2013.01)

(58) Field of Classification Search
None
See application file for complete search history.

(56) References Cited

U.S. PATENT DOCUMENTS

| | | | |
|---|---|---|---|
| 2005/0053326 A1 | 3/2005 | Toney | |
| 2006/0071585 A1* | 4/2006 | Wang | H01K 1/14 313/315 |

(Continued)

FOREIGN PATENT DOCUMENTS

| | | | |
|---|---|---|---|
| CN | 103592781 A | * | 2/2014 |
| DE | 102005008077 A1 | | 8/2006 |

OTHER PUBLICATIONS

O'Regan, Bryan J., et al., "Silicon photonic crystal thermal emitter at near-infrared wavelengths", Scientific Reports, www.nature.com/scientificreports, Aug. 21, 2015, 8 pages.

(Continued)

*Primary Examiner* — Edwin C Gunberg
(74) *Attorney, Agent, or Firm* — Slater Matsil, LLP (57) ABSTRACT

An emitter for emitting electromagnetic radiation includes a first region for thermally generating electromagnetic radiation, wherein the first region includes a first photonic crystal of the type having a first periodical structure with first holes having a first dimension and being at a first periodicity, so as to define a first dimension-to-periodicity ratio; and a second region for filtering the electromagnetic radiation generated in the first region, wherein the second region includes a second photonic crystal of the type having a second periodical structure with second holes having a second dimension and being at a second periodicity, so as to define a second dimension-to-periodicity ratio, wherein the second dimension-to-periodicity ratio is different from the first dimension-to-periodicity ratio.

20 Claims, 5 Drawing Sheets

(56) References Cited

U.S. PATENT DOCUMENTS

2007/0034978 A1    2/2007  Pralle et al.
2009/0236614 A1    9/2009  Puscasu et al.
2017/0082421 A1*   3/2017  Baets ................. G02B 6/12019

OTHER PUBLICATIONS

Celanovic, Ian et al., "Two-dimensional tungsten photonic crystals as selective thermal emitters", Applied Physics Letters, 92, 193101, May 13, 2008, 3 pages.
Inoue, Takuya et al., "Spectral control of near-field thermal radiation via photonic band engineering of two-dimensional photonic crystal slabs", Optics Express 32074, vol. 26, No. 24, Nov. 26, 2018, 9 pages.

* cited by examiner

DEVICE AND METHOD FOR EMITTING ELECTROMAGNETIC RADIATION

This application claims the benefit of European Patent Application No. 19165621, filed on Mar. 27, 2019, which application is hereby incorporated herein by reference.

TECHNICAL FIELD

The present document relates to an emitter, e.g. an emitter for infrared radiation and/or for a gas sensor. The document also relates to a non-dispersive optical gas sensor, such as a non-dispersive infrared, NDIR, sensor.

The document also relates to a method for emitting electromagnetic radiation and a method for detecting the amount of a gas.

BACKGROUND

An emitter for emitting electromagnetic radiation may be used, for example, as a radiation source, for a device such as a non-dispersive optical gas sensor and/or a non-dispersive infrared (NDIR) sensor. The emitter is intended at generating radiation at a precise wavelength.

As each gas has at least one particular wavelength of maximum absorption, it is in general necessary, in order to detect the presence and/or determine the quantity of particles of a particular gas, to irradiate the gas with electromagnetic radiation of the particular wavelength. For example, carbon dioxide is in general irradiated at 4.26 µm. For this reason, a sensor such as a NDIR sensor equipped with an emitter as above is in general required.

Precision is important for this kind of application and, therefore, techniques are necessary for increasing the precision and the effectiveness of the emitter and of the sensor.

SUMMARY

In accordance with an aspect, there is provided a device for emitting electromagnetic radiation, comprising:

a first region for thermally generating electromagnetic radiation, wherein the first region includes a first photonic crystal of the type having a first periodical structure with first holes having a first dimension and being at a first periodicity, so as to define a first dimension-to-periodicity ratio; and a second region for filtering the electromagnetic radiation generated in the first region, wherein the second region includes a second photonic crystal of the type having a second periodical structure with second holes having a second dimension and being at a second periodicity, so as to define a second dimension-to-periodicity ratio, wherein the second dimension-to-periodicity ratio is different from (e.g., smaller than) the first dimension-to-periodicity ratio.

Accordingly, photonic crystal structures may be obtained with bandgap in their optical dispersion. The bandgap, which is a forbidden frequency range, is such that no photon can be generated or propagated. It has been noted that, by a combined effect of the first region with the second region, a narrow band around a preferred wavelength may be obtained.

According to an aspect, there may be provided a third matching region including a third photonic crystal having a third periodical structure with third holes of at least one third dimension and at at least one third periodicity, wherein at least one dimension-to-periodicity ratio is different from (e.g., smaller than) the second dimension-to-periodicity ratio, respectively. This third region may provide an adiabatic reduction of the hole sizes and act as a matching area between the momentum of the filtering part and the momentum of the guiding area.

In accordance with an aspect, there may be defined a mirror region (fourth region) which permits to increase efficiency by redirecting photons propagating in the direction opposite to the propagation direction.

In accordance with an aspect, there is provided a non-dispersive optical gas sensor comprising: an emitter as above and a guiding region arranged in a gas environment, so as to irradiate the gas with electromagnetic radiation emitted by the emitter, and a detector for detecting the electromagnetic radiation. Accordingly, the efficiency is increased and a narrow band around the necessary wavelength is obtained.

The emitter may be configured to emit electromagnetic radiation at the wavelength of maximum absorption of carbon dioxide.

In accordance with an aspect there is provided a method for emitting electromagnetic radiation, comprising:

generating electromagnetic radiation in a first region including a first photonic crystal having a first periodical structure with first holes at a first dimension-to-periodicity ratio;

filtering the generated electromagnetic radiation in a second region including a second photonic crystal having a second periodical structure with second holes at a second dimension-to-periodicity ratio, the first dimension-to-periodicity ratio being different from (e.g., larger than) the second dimension-to-periodicity ratio.

In accordance with an aspect there is provided a method for detecting the amount of a gas, comprising:

irradiating the gas with electromagnetic radiation as above, wherein the emitted electromagnetic radiation is associated to the wavelength of maximum absorption of the gas; and measuring the intensity of the emitted electromagnetic radiation to determine the quantity of the gas.

The figures show examples which are not necessarily proportional to dimensions for real implementations.

DETAILED DESCRIPTION OF ILLUSTRATIVE EMBODIMENTS

Figure 1:
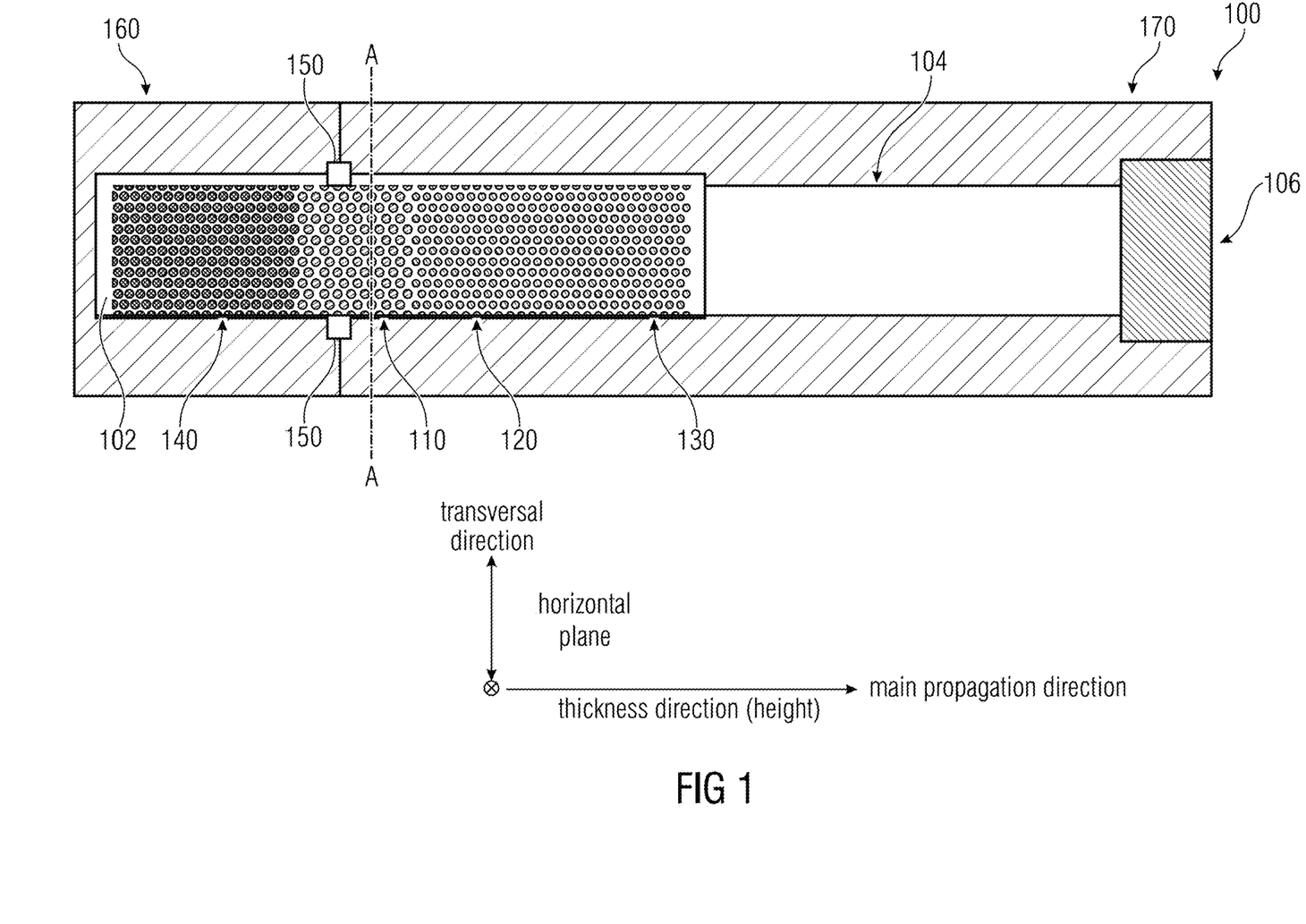
FIG. 1 shows a planar view of an example.
Figure 2:
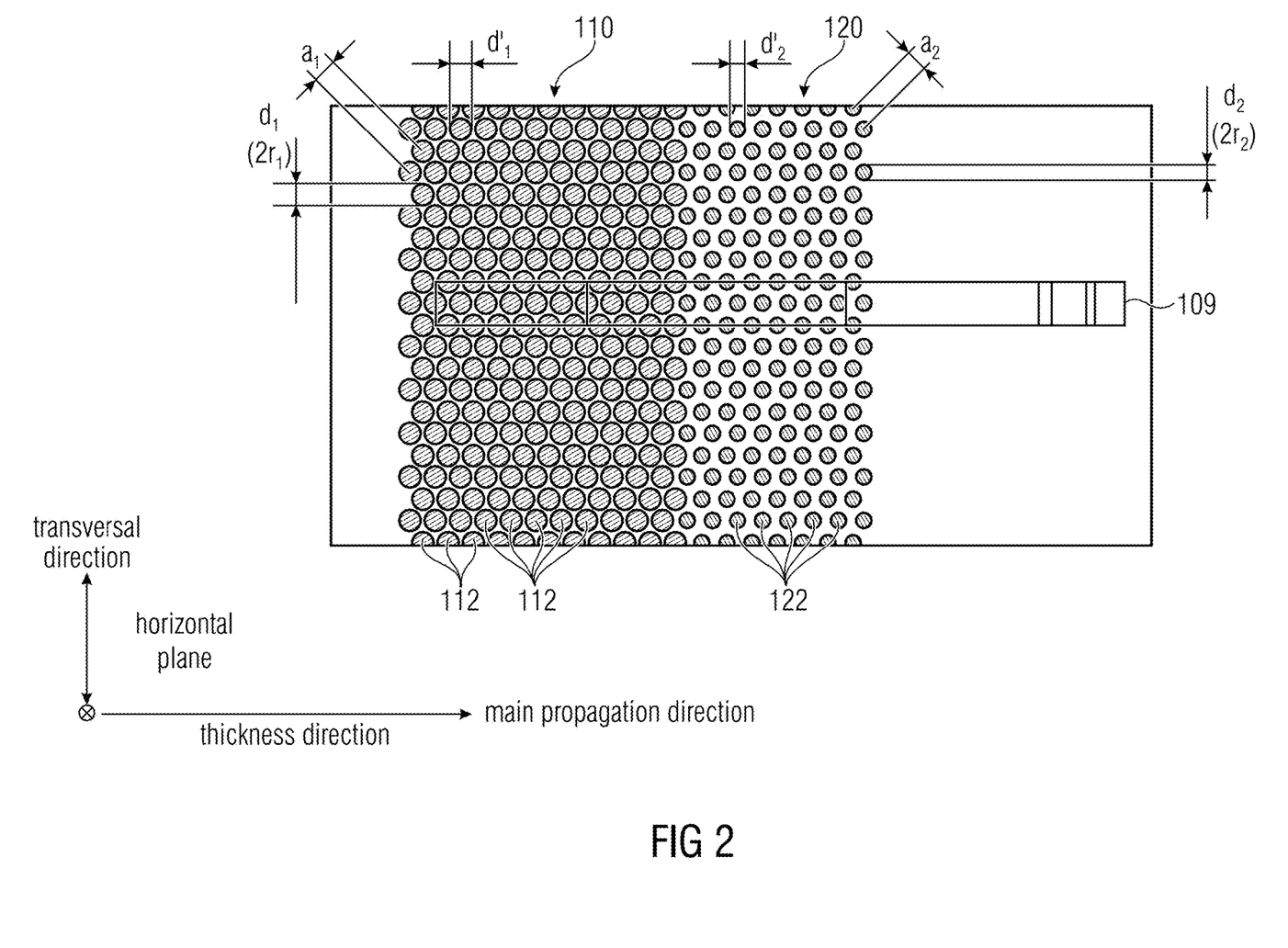
FIG. 2 shows a simplified planar view of the example of FIG. 1.
Figure 3:
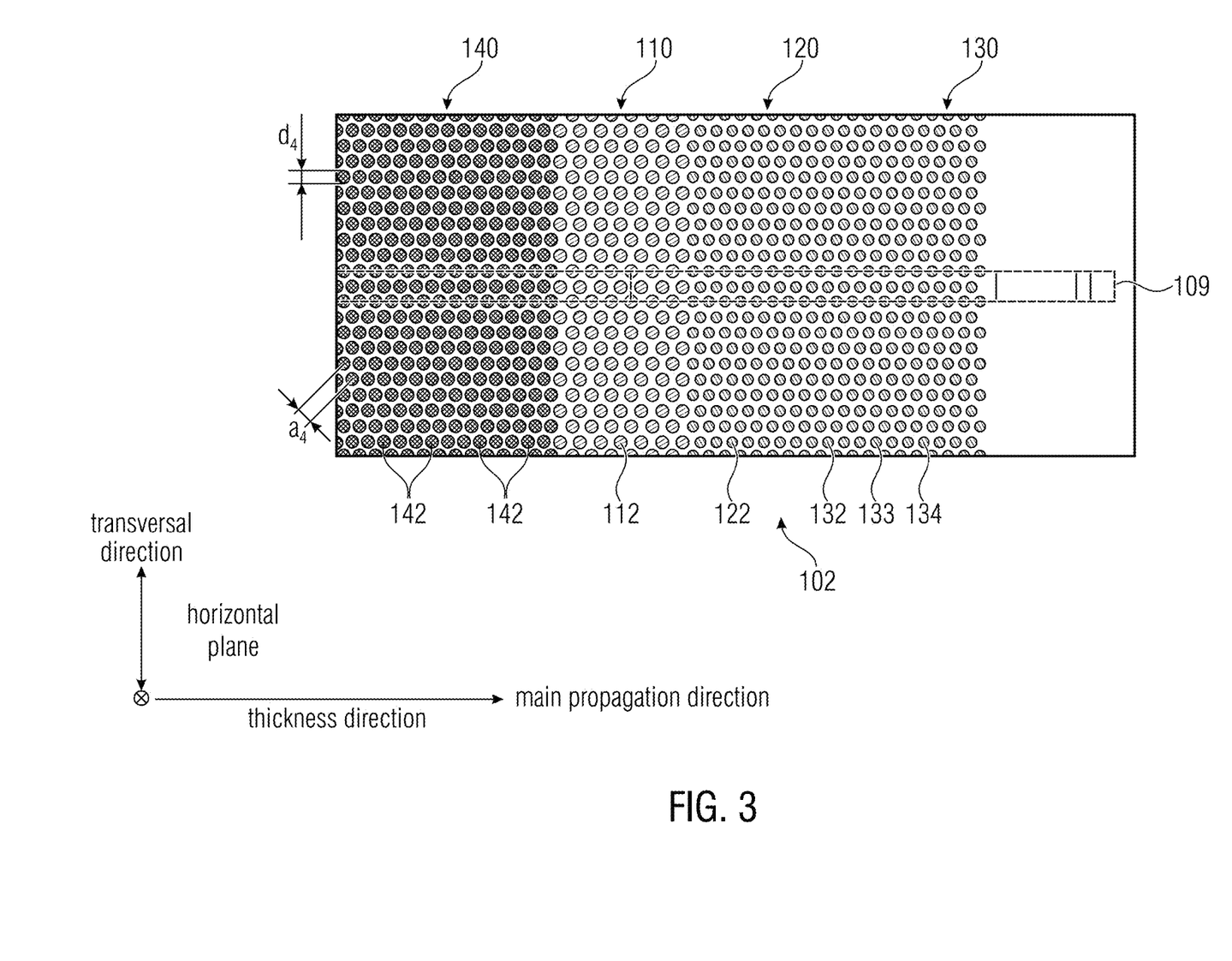
FIG. 3 shows an enlarged view of a particular of FIG. 1.
Figure 5:
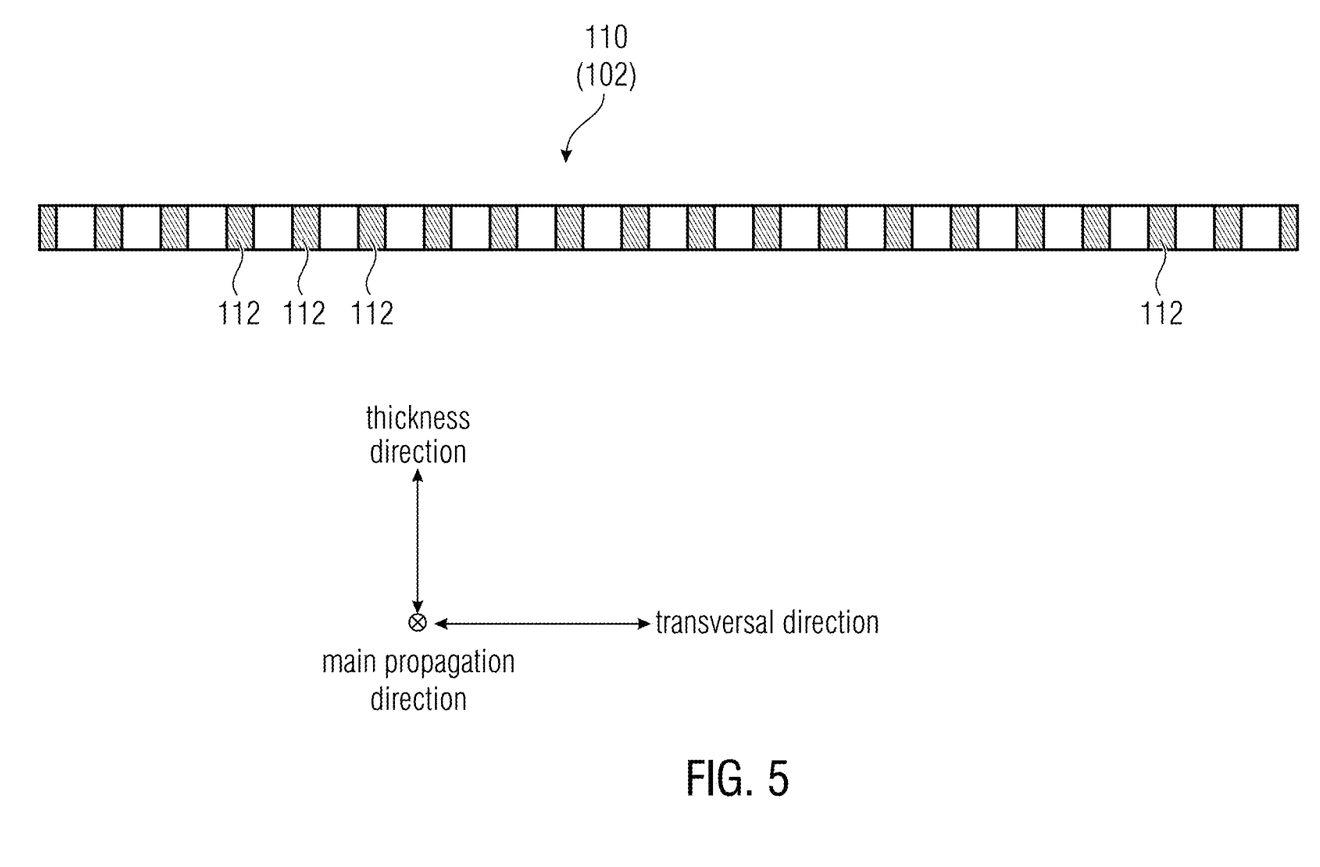
FIG. 5 shows an enlarged cross-sectional view obtained at the line A-A of FIG. 1.

FIGS. 1, 3, and 5 show an example of an emitter 102 for emitting electromagnetic radiation. FIG. 2 shows a simplified view of the emitter 102, in which portions 130 and 140 are not shown (FIG. 2 may be understood as showing a variant of the example of FIGS. 1, 3, and 5). The emitter 102 may be part of a non-dispersive optical gas sensor 100 or of another type of device. The emitter 102 may comprise a first region 110 for generating electromagnetic waves and/or a second region 120 for filtering the electromagnetic waves.

The emitter 102 may develop in a horizontal plane (which is the same of or is parallel to the plane of the paper in FIGS. 1, 2, and 3, and is perpendicular to the plane of the paper in FIG. 5). The radiation is meant at propagating principally in the horizontal plane from a proximal region 160 towards a distal region 170 according to a main propagation direction (e.g., in the horizontal plane). A transversal direction, in the horizontal plane, may be perpendicular to the main propagation direction. The emitter 102 (and, more in general, the sensor 100) may also develop according to a thickness direction (or height direction) which is perpendicular to the horizontal plane.

The emitter 102 may use photonic crystals (PhCs). A photonic crystal can be described as a periodic modification of a dielectric medium approximately at the scale of the wavelength. In analogy to semiconductors, in which the presence of a periodic potential for electrons results in electronic bands, in PhCs a periodic refractive index leads to photonic bands for photon propagation. Photonic band structures and photonic band gaps may forbid the transmission of photons with certain frequencies in all in-plane directions.

The emitter 102 may comprise a plurality of regions (e.g., 110, 120, 130, 140), whose properties are discussed in detail below. At least one of these regions may present a periodical structure with a plurality of holes displaced according to a periodic lattice (e.g., hexagonal periodic lattice as shown in the figures, or, in alternative, another kind of periodical structure, such as a square periodic lattice, etc.). In examples, the dimension-to-periodicity ratio may be different for different regions. For example, the periodicity may be the same for the different regions, but the dimensions (e.g., diameter, radius, etc.) may be different for different regions.

The first region 110 may be configured for thermally generating electromagnetic radiation (such as infrared, IR, wavelength). The first region 110 may include a first photonic crystal having a first periodical structure with first holes 112 displaced according to a first center distance (periodicity) $a_1$ (e.g. hexagonal periodic lattice as shown in the figures, or, in alternative, another kind of periodical structure, such as a square periodic lattice, etc.). Each of the first holes 112 may have a first dimension (e.g., a diameter $d_1$, a radius $r_1=d_1/2$, or another mono-dimensional length extension, which may be measured, e.g., in the transversal direction). The first holes 112 may be geometrically shaped and displaced so as to have a first dimension-to-periodicity ratio (e.g., $d_1/a_1$ or $r_1/a_1$). FIGS. 2 and 3 show the distance 109 of two consecutive holes 112 and 122 as taken along the transversal direction.

The second region 120 may be configured for filtering (e.g., high-pass filtering) electromagnetic radiation generated in the first region 110. The second region 120 may include a second photonic crystal of a type having a second periodical structure (e.g. hexagonal periodic lattice as shown in the figures, or, in alternative, another kind of periodical structure, such as a square periodic lattice, etc.) which is in general different from the first periodical structure of the first region 110. The second periodical structure of the second region 120 may comprise second holes 122, which may have a second periodicity or second center distance (e.g., $a_2$), which may be the same of or different from the first periodicity or center distance (in this case, $a_1=a_2$, but in some cases $a_1 \neq a_2$, e.g., $a_1>a_2$ or $a_1<a_2$). Each of the second holes 122 may have a second dimension (e.g., a diameter $d_2$ or a radius $r_2=d_2/2$), which may be the same of or different from the first dimension (e.g., $d_1$, $r_1$) of the first holes 112 (in this case, $d_1>d_2$ and $r_1>r_2$, but in some cases $d_1=d_2$ and $r_1=r_2$).

The holes 112 and/or 122 may be displaced along rows elongated in the main propagation direction. Each row may be staggered with respect to the adjacent rows. As can be seen from FIG. 2, the holes 112 and/or 122 may also be seen as elongated in a slanted direction (60° with respect to the main propagation direction) to form a periodic hexagonal lattice. Other periodic and/or symmetric structures may be used.

It has been noted that it is accordingly possible to provide extremely precise and narrow bandwidth for the radiation. In particular, each of the photonic crystal structures in the first and second regions 110 and 120 may have a bandgap in its optical dispersion. The bandgap is a forbidden frequency range, in which a photon cannot be generated or propagated. Photons are generated and propagated in a desirable narrow frequency range.

The first photonic crystal of the first region 110 may be in highly-doped semiconductor material. The second photonic crystal of the second region 120 may be in undoped semiconductor material and/or low-doped semiconductor material. At least one of the first and second regions 110, 120 may be in polysilicon. For example, the first photonic crystal of the first region 110 can be doped polysilicon with a concentration of $1 \times 10^{20}$ cm$^{-3}$ or, more in general, $1 \times 10^{20}$ cm$^{-3} \pm 5\%$, or more in general, more than $1 \times 10^{19}$ cm$^{-3}$.

As also shown in FIGS. 2 and 3, first holes 112 of the first region 110 may have a first dimension (e.g., $d_1$, $r_1$) which may be different from (e.g., larger than) the second dimension (e.g., $d_2$, $r_2$) of second holes 122 of the second region 120. The first and second dimensions (which may be parallel with each other) may be understood as being taken in the transversal direction.

The first dimension of the first holes 112 may be the diameter $d_1$, the radius $r_1=d_1/2$, or another measure of each of the first holes 112 as taken in the transversal direction (all or at least the majority of the first holes 112 in the first region 110 may have the same measurements and/or properties). The second dimension of the second holes 122 may be the diameter $d_2$, the radius $r_2=d_2/2$, or another measure of each of the second holes 122 as taken in the transversal direction (all or at least the majority of the second holes 122 in the second region 120 may have the same measurements and/or properties).

In some examples, the dimensions of the holes 112 and 122 along the main propagation direction may be irrelevant or play a less important role for the purpose of attaining the technical effects discussed here. Just to give an example, the dimensions $d'_1$ and $d'_2$ of FIG. 2, taken along the main propagation direction, may be irrelevant (of course, in case of circular holes, $d_1=d'_1$ and $d_2=d'_2$, but, in case of oval holes, the dimension in the main propagation direction could be irrelevant). If the first holes 112 (and/or the second holes 122, respectively) are oval holes with major axis parallel to the transversal direction, the first dimension (and/or second dimension, respectively) will be the dimension of the holes taken in the major axis of the oval. Analogously, if the first holes 112 (and/or the second holes 122, respectively) are oval holes with minor axis parallel to the transversal direction, the first dimension (and/or second dimension, respectively) will be the dimension of the first holes 112 (or second holes 122, respectively) as taken in the minor axis of the oval. Therefore, the first dimension of a hole 112 or 122 may be the distance between the perimetric points of the same first hole as taken in the transversal direction.

In FIG. 2, the periodicity (or center distance) $a_1$ for the first holes 112 of the first region 110 is the same of the periodicity (or center distance) $a_2$ of the second holes 122 of the second region 120. Notwithstanding, the first dimension-to-periodicity ratio is greater than the second dimension-to-periodicity ratio, as the first holes 112 have a first dimension being larger than the second dimension of the second holes 122, by virtue of the diameter $d_1$ (and the radius $r_1$) of the first holes 112 being larger than diameter $d_2$ (and the radius $r_2$) of the second holes 122.

When referring to the first and second periodicities (or center distances) $a_1$ and $a_2$) and the first and second dimensions ($d_1$ or $r_1$ and $d_2$ or $r_2$) of the first and second holes 112 and 122, it is referred to the openings of the first and second holes 112 and 122 (which are circular in FIGS. 1-3), which extend in the horizontal plane. However, the first holes 112 and the second holes 122 may extend in the thickness direction, so as to be cavities in the first and/or second crystal. For example, the first holes 112 and the second holes 122 may cylindrically or prismatically extend in the thickness direction (see FIG. 5). As the radiation is meant at propagating in the horizontal plane, both the first holes 112 and the second holes 122 may be cavities which extend along the thickness direction perpendicular to the horizontal plane. The first holes 112 and/or the second holes 122 may have a cylindrical or prismatic shape, for example, in which the height of the cylinder or prism is perpendicular to the opening of the first holes 112 (and to the first dimension) and the second holes 122 (and to the second dimension).

The holes 112 and 122 may be through-holes, and they may traverse the structure of the first and second regions 110 and 120 in the thickness direction.

The first photonic crystal in the first region 110 may generate the radiation by virtue of electrodes 150 electrically connected to the first photonic crystal in the first region 110. The electrodes 150 may be spaced from each other by the traversal extension of the structure in the transversal direction. The electrodes 150 may define and/or be spaced by the transversal extension of the emitter 102. In particular, the electrodes 150 may be in two different lateral sides of the first region 110, so as to force an electric current traversing the first region 110 in the transversal direction. By the action of the electrodes 150, the temperature of the first photonic crystal may be increased by Joule-effect, so as to irradiate electromagnetic waves following the theory of the Black Body (e.g., in dependence on the temperature). The high porosity of the first region 110 may permit to reduce thermal conductivity, which increases the maximum achievable temperature and the total generated flux.

The first and second regions 110 and 120 may be adjacent to each other. The first and second regions 110 and 120 may have the same thickness. The first and second regions 110 and 120 may have the same traversal extension in the transversal direction. The first and second photonic crystals may be in contact with each other (and, for example, they may have been manufactured starting from one single piece). The second region 120 may protrude more distally with respect to the first region 110 towards the distal region 170.

FIGS. 1 and 3, for example, show a third region 130 (matching region), which is not shown in FIG. 2. The third region 130 may include a third photonic crystal having a third periodical structure with third holes 132, 133, 134, etc., of at least one third dimension (e.g., a dimension taken along the transversal direction) and being placed at at least one third center distance from each other, e.g., according to a third periodicity so as to define at least one third dimension-to-periodicity ratio. The third dimension may be the diameter (e.g., $d_{132}$ for the hole 132, $d_{133}$ for the hole 133, $d_{134}$ for the hole 134) or another dimension in the transversal direction, while the third periodicity or center distance (e.g., $a_{132}$ for the hole 132, $a_{133}$ for the hole 133, $a_{134}$ for the hole 134). The same considerations for the first and second dimensions and the first and second periodicities, as discussed above, may apply to the third dimension and the third periodicity. In particular, the third dimensions may be taken in the main propagation direction. The third holes 132, 133, 134 may be through holes (like holes 112 and 122), and their height may extend in the thickness direction. Even for the third region 130, a hexagonal periodic lattice, or, in alternative, another kind of periodical structure, such as a square periodic lattice, may be chosen.

The at least one third dimension-to-periodicity ratio may be smaller than the first and the second dimension-to-periodicity ratio. E.g., it may be that $d_{132}/a_{132}<d_1/a_1$ and/or $d_{132}/a_{132}<d_2/a_2$, and the same for holes 133 and 134. The same may be valid by substituting the radii to the diameters.

In general terms, the third region 130 may be adjacent to the second region 120 and may be constructed from the same piece. The second and third regions may have the same thickness. The second and third regions may have the same traversal extension in the transversal direction. The third region 130 may be in semiconductor material (e.g., polysilicon), which may be undoped.

In examples, the third dimension-to-periodicity ratio of the third photonic crystal may change along the main propagation direction (e.g., from left to right in FIGS. 1-3). For example, along the main propagation direction (towards the distal region 170), the periodicity between the third holes may progressively increase, while the third dimension (e.g., the diameter or radius) of the third holes may remain constant: hence, the third dimension-to-periodicity ratio may become progressively smaller towards the distal region 170. For example, if each of the third holes 132, 133, 134 has a diameter $d_{132}$, $d_{133}$, $d_{134}$, respectively, it may follow that $d_{132}>d_{133}>d_{134}$ (it may also be $d_1>d_{132}$ and/or $d_2>d_{132}$). In addition or alternative, if the periodicity is $a_{132}$, $a_{133}$, $a_{134}$, respectively, it may follow that $a_{132}<a_{133}<a_{134}$ (it may also be $a_1<a_{132}$ and/or $a_2<a_{132}$). In addition or alternative, it may follow that $d_{132}/a_{132}>d_{133}/a_{133}>d_{134}/a_{134}$. In addition or alternative, it may follow that $d_{32}/a_{132}>d_{133}/a_{133}>d_{134}/a_{134}$. The same may be obtained, for example, by substituting the diameters with the radii.

Analogously, as in FIG. 3, along the main propagation direction, towards the distal region 170, the periodicity ($a_{132}$, $a_{133}$, $a_{134}$) between third holes 132-134 may remain constant, while the third dimension (in this case, the diameter $d_{132}$, $d_{133}$, $d_{134}$ or radius $r_{132}=d_{132}/2$, $r_{133}=d_{133}/2$, $r_{134}=d_{134}/2$) of the third holes 132-134 may become progressively more and more small (i.e., $d_{13}2>d_{133}>d_{134}$). It can be seen that the hole 132 has a diameter larger than the hole 133, which in turn has a diameter larger than the hole 134: the third dimension-to-periodicity ratio may become progressively smaller towards the distal region 170. In the example of FIGS. 1 and 3, $a_{132}=a_{133}=a_{134}=a_1=a_2$.

Other combinations may be carried out, so as to progressively reduce the third dimension-to-periodicity ratio. In examples such as in that of FIG. 2, the third region 130 may be avoided.

The emitter 102 may comprise a mirror region (fourth region) 140. The mirror region 140 may be counter-posed to the second region 120 with respect to the first region 110. The first region 110 may be interposed between the mirror region 140 and the second region 120. The mirror region 140 may be more proximal than the first region 110 in the main propagation direction.

The mirror region 140 may invert the propagation of radiation propagating in the direction opposite to the main propagation direction. The first region and the mirror region may have the same thickness. The first region and the mirror region may have the same traversal extension in the transversal direction. The mirror region 140 may have fourth holes 142. Also, the fourth holes 142 may be (e.g. similar to the holes 112, 122, 132-134 of the regions 110, 120, 130) through-holes. The mirror region 140 may be in semiconductor material (e.g., polysilicon). The mirror region 140 may be undoped. The mirror region 140 may be may be made of the same material of the regions 110 and 120. The fourth holes 142 may have a fourth dimension-to-periodicity ratio which is smaller than the first dimension-to-periodicity ratio, and/or larger than the second dimension-to-periodicity ratio. For example, if the fourth holes 142 have diameter $d_4$ and periodicity (or center distance) $a_4$, it may follow that $d_4/a_4 < d_1/a_1$ and/or that $d_4/a_4 > d_2/a_2$. The same considerations apply by substituting radii to the diameters.

The fourth periodicity ($a_4$) and the fourth dimension ($d_4$) may be taken along the transversal direction. In the example of FIGS. 1 and 3, $a_4=a_1=a_2$.

The mirror region 140 may operate a wide-band photonic region to reduce emissions towards side of the proximal region. In examples, in the mirror region 140 is not traversed by current (e.g., by virtue of non-being doped).

For the fourth region 140, the same considerations for the holes, rows, periodicities, diameters, etc. of those discussed above for regions 110, 120, and 130 may apply. For example, a hexagonal periodic lattice, or, in alternative, another kind of periodical structure, such as a square periodic lattice, may be chosen.

Resuming, in examples such as in that of FIGS. 1 and 3, the following structure in the main propagation direction from the proximal region 16o to the distal region 170 may be obtained:

a mirror region 140 with a fourth dimension-to-periodicity ratio; and/or a first region 110 (e.g. interposed by two electrodes 150 in the lateral sides), with a first dimension-to-periodicity ratio (which may be larger than the fourth dimension-to-periodicity ratio); and/or a second region 120, with a second dimension-to-periodicity ratio different from (e.g., smaller than) the first dimension-to-periodicity ratio (the second dimension-to-periodicity ratio may be different from, e.g., greater than, the fourth dimension-to-periodicity ratio); and/or a third region 130, with at least one third dimension-to-periodicity ratio smaller than the second dimension-to-periodicity ratio, and possibly progressively reducing towards the distal region 170.

Each or at least one of the regions 110, 120, 130, 140 may substantially operate as a photonic crystal structure, i.e. a periodic optical nanostructure that affects the motion of photons, filtering the photons (i.e. in the main propagation direction). By virtue of the filtering obtained by the photonic crystal structures, the wavelengths result to be precisely those that are necessary on the basis of the geometric structures of the photonic crystals.

In general terms, the thickness and/or the transversal extension of all or some of the regions (e.g., 110, 120, 130 and/or 140) may be the same.

Figure 4:
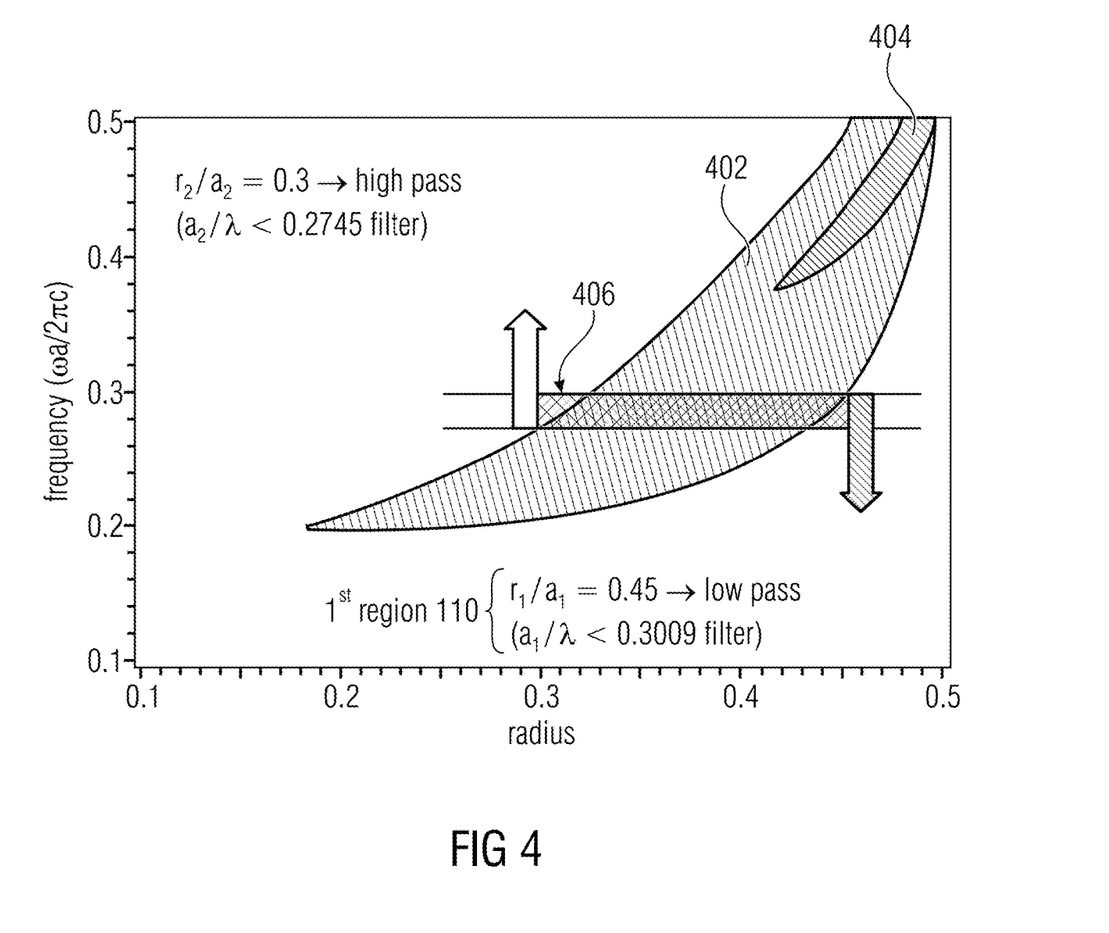
FIG. 4 shows a map of the bandgap as a function of a dimension-to-periodicity ratio.

FIG. 4 shows a map of a bandgap as a function of radius-to-period for transverse magnetic (TM) modes 402 and TE-TM (transverse electric-transverse magnetic) modes 404 in the first and second regions 110 and 120. The radius is associated to the first or second dimension, while the period is associated to the first or second periodicity.

The band of interest (which in this case is meant at being the narrow absorption band of carbon dioxide, and therefore is 4.26 μm) is within, e.g., in the center of, the area indicated with 406. In the graph, the abscissa indicates the radius (first and second dimensions of respective holes 112 and 122) and the ordinate indicates a frequency ($\omega a/2\pi c$, where c indicates the speed of light in vacuum, $c \approx 3 \times 10^8$ m/s, and a is the periodicity, e.g. $a_1$ or $a_2$).

As shown by FIG. 4, the band of interest is achieved by combining the use of a low-pass filter (obtained by the first region 110) with the use of a high-pass filter (obtained by the second region 120). In this case, as shown in FIG. 2, the periodicity (or center distance) between the holes (112 or 122) of the same region (110 or 120) is hypothesized as equal for both the first and second regions 110, 120 ($a_1=a_2$), but it could be different in different cases. As shown, in the first region 110, the radius-to-periodicity ratio is 0.45, wherein "$r_1$" is the radius and "$a_1$" is the periodicity (or center distance). The high-pass filter is obtained by the second region 120, with $r_2/a_2=0.3$. Accordingly, it will be possible to obtain the narrow band 406 around the wavelength 4.26 μm by choosing the appropriated values of dimensions of the first holes 112 of the first region 110, the second holes 122 of the second region 120, and the first and second periodicities. While the example has been used for the value of 4.26 μm, any other wavelength may be obtained by modifying the geometric parameters such as those affecting the dimension-to-periodicity ratio.

In some examples (e.g., for a wavelength of 4.26 μm), it may be:

$$\frac{r_2}{a_2} = 0.3$$

$$\frac{a_2}{\lambda} < 0.2745$$

$$\frac{r_1}{a_1} = 0.45$$

$$\frac{a_1}{\lambda} > 0.3009$$

(for $a_1$, $a_2$, $r_1$, $r_2$, a tolerance of ±1% or ±5% or ±10% may be chosen).

Other values wavelengths may be obtained using different values of $a_1$, $a_2$, $r_1$, $r_2$.

The presence of the mirror region 140 and/or the third region 130 permit to further increase efficiency. The mirror region 140 may reduce emission to the unintended side (e.g. proximal end).

It has also been noted that, by increasing the porosity of the mirror region 140, a higher local temperature can be obtained by virtue of its decreased thermal conductivity.

The third region 130 may operate as a matching region and, by virtue of an adiabatic reduction of the holes' size, the third region 130 may act as a matching area between the momentum of the filtering part (first and second regions 110 and 120) and the momentum of the subsequent guiding area (see below).

FIG. 1 also shows other elements of a non-dispersive optical gas sensor (which may be a NDIR gas sensor). A guiding region 104 may be placed in a distal position with respect to the emitter 102. The guiding region 104 may be arranged that in a gas environment, so as to irradiate the gas with electromagnetic radiation at the narrow band emitted by the emitter 102.

A detector 106 may detect the electromagnetic radiation propagated along the guiding region 104. The detector 106 may measure the intensity of the radiation at the specific wavelength emitted by the emitter 102. In accordance with the detected intensity, a logic (not shown) may infer the quantity of gas particles that have absorbed the radiation.

In examples, the first and second regions 110, 120, the electrodes 150, at least some of the mirror regions 140, the third region 130, and the guiding region 104 and/or the detector 106 and/or the logic for inferring the quantity of gas particles may be enclosed in a chip structure and/or in a package structure. The chip structure or the package structure may enclose the at least first region 110 and/or the second region 120 or part or the whole group of elements listed above. The chip structure or package structure may also comprise a means for providing the gas whose quantity is to be measured.

In examples, the birthplace and the spectral filtering of the radiation happens in the same platform (e.g., a single silicon platform), hence avoiding the use of multiple, different devices. Accordingly, efficiency is increased. The effort in fabricating the emitter is notwithstanding low.

The examples above may also be used for a method for emitting electromagnetic radiation, which may comprise:

generating electromagnetic radiation in a first region (110) including a first photonic crystal having a first periodical structure with first holes (112) at a first dimension-to-periodicity ratio;

filtering the generated electromagnetic radiation in a second region (120) including a second photonic crystal having a second periodical structure with second holes (122) at a second dimension-to-periodicity ratio, the first dimension-to-periodicity ratio being different from (e.g., larger than) the second dimension-to-periodicity ratio.

The method may be used for a method for detecting the amount of a gas, which may comprise:

irradiate the gas with electromagnetic radiation according to a technique discussed above, wherein the emitted electromagnetic radiation is associated to the wavelength of maximum absorption of the gas;

measuring the intensity of the emitted electromagnetic radiation to determine the quantity of the gas.

Other method steps may be implied by the functional/structural features of the emitter and the sensor above.

The following is a non-exhaustive list of wavelengths that can be used for determining the amount of each material (source: Wikipedia). By defining different dimension-to-periodicity ratios as explained above at least for the first and second regions 110, 120, it is possible to measure the amount of each of the following gases. Tolerances of ±1% or ±5% or +10% may be chosen.

$O_2$: 0.763 µm
$CO_2$: 4.26 µm, 2.7 µm, about 13 µm
CO: 4.67 µm, 1.55 µm, 2.33 µm, 4.6 µm, 4.8 µm, 5.9 µm
$NO_2$—6.17-6.43 µm, 15.4-16.3 µm, 496 nm
$N_2O$—7.73 µm, 1.52 µm, 4.3 µm, 4.4 µm, about 8 µm
$HNO_3$—5.81 µm
$NH_3$—2.25 µm, 3.03 µm, 5.7 µm
$H_2S$—1.57 µm, 3.72 µm, 3.83 µm
$SO_2$—7.35 µm, 19.25 µm
HF—1.27 µm, 1.33 µm
HCl—3.4 µm
HBr—1.34 µm, 3.77 µm
HI—4.39 µm
hydrocarbons—3.3-3.5 µm, the C—H bond vibration
$CH_4$—3.33 µm, 7.91±0.16 µm can also be used, 1.3 µm, 1.65 µm, 2.3 µm, 3.2-3.5 µm, about 7.7 µm
$C_2H_2$—3.07 µm
$C_3H_8$—1.68 µm, 3.3 µm
$CH_3Cl$—3.29 µm
$H_2O$—1.94 µm, 2.9 µm
$O_3$— 9.0 µm, also 254 nm (UV)
$H_2O_2$—7.79 µm
alcohol mixtures—9.5±0.45 µm
HCHO—3.6 µm
HCOOH—8.98 µm
COS—4.87 µm While this disclosure has been described with reference to illustrative embodiments, this description is not intended to be construed in a limiting sense. Various modifications and combinations of the illustrative embodiments, as well as other embodiments of this disclosure, will be apparent to persons skilled in the art upon reference to the description. It is therefore intended that the appended claims encompass any such modifications or embodiments.

What is claimed is:

1. An emitter for emitting electromagnetic radiation, comprising:

a first region for thermally generating electromagnetic radiation, wherein the first region includes a first photonic crystal of the type having a first periodical structure with first holes having a first dimension and being at a first periodicity, so as to define a first dimension-to-periodicity ratio; and a second region for filtering the electromagnetic radiation generated in the first region, wherein the second region includes a second photonic crystal of the type having a second periodical structure with second holes having a second dimension and being at a second periodicity, so as to define a second dimension-to-periodicity ratio, wherein the second dimension-to-periodicity ratio is different from the first dimension-to-periodicity ratio, wherein the first region is immediately adjacent to the second region, wherein an upper surface of the first region is coplanar with an upper surface of the second region, and wherein a lower surface of the first region is coplanar with a lower surface of the second region.

2. The emitter of claim 1, wherein
the second dimension-to-periodicity ratio is smaller than the first dimension-to-periodicity ratio.

3. The emitter of claim 1, wherein
the first photonic crystal of the first region is in high-doped semiconductor material.

4. The emitter of claim 1, wherein
the second photonic crystal of the second region is in undoped semiconductor material or low-doped semiconductor material.

5. The emitter of claim 1, further comprising
a matching region including a third photonic crystal having at least a third periodical structure with third holes of at least one third dimension and being at at least one third periodicity, so as to define at least one third dimension-to-periodicity ratio, respectively, wherein the at least one third dimension-to-periodicity ratio is different from the second dimension-to-periodicity ratio.

6. The emitter of claim 5, wherein
the at least one third dimension-to-periodicity ratio is smaller than the second dimension-to-periodicity ratio.

7. The emitter of claim 5, wherein
the at least one third dimension-to-periodicity ratio is progressively modified in a direction towards a distal region.

8. The emitter of claim 5, wherein the matching region is immediately adjacent to the second region, wherein an upper surface of the matching region is coplanar with an upper surface of the first region and the second region, and wherein a lower surface of the matching region is coplanar with a lower surface of the first region and the second region.

9. The emitter of claim 1, further comprising
a mirror region, so that the first region is between the mirror region and the second region.

10. The emitter of claim 9, wherein
the mirror region includes a fourth photonic crystal of the type having a fourth periodical structure with fourth holes having a fourth dimension and being at a fourth periodicity,
so as to define a fourth dimension-to-periodicity ratio which is smaller than the first dimension-to-periodicity ratio.

11. The emitter of claim 10, wherein the fourth dimension-to-periodicity ratio is larger than the second dimension-to-periodicity ratio.

12. The emitter of claim 9, wherein the mirror region is immediately adjacent to the first region, wherein an upper surface of the mirror region is coplanar with an upper surface of the first region and the second region, and wherein a lower surface of the mirror region is coplanar with a lower surface of the first region and the second region.

13. The emitter of claim 10, wherein the periodical structures of at least two regions have the same periodicity and different dimension of the holes.

14. The emitter of claim 1, further comprising
a chip structure or a package structure enclosing at least the first region and the second region.

15. A non-dispersive optical gas sensor, comprising:
an emitter configured to emit electromagnetic radiation, the emitter being configured according to claim 1;
a guiding region arranged in a gas environment, to irradiate the gas with electromagnetic radiation emitted by the emitter; and
a detector for detecting the electromagnetic radiation, so as to measure a quantity of gas particles on the basis of a detected radiation intensity.

16. A method for emitting electromagnetic radiation, comprising:
generating electromagnetic radiation in a first region including a first photonic crystal having a first periodical structure with first holes a first dimension-to-periodicity ratio; and
filtering the generated electromagnetic radiation in a second region including a second photonic crystal having a second periodical structure with second holes at a second dimension-to-periodicity ratio,
wherein the second dimension-to-periodicity ratio is different from the first dimension-to-periodicity ratio, wherein the first region is immediately adjacent to the second region, wherein an upper surface of the first region is coplanar with an upper surface of the second region, and wherein a lower surface of the first region is coplanar with a lower surface of the second region.

17. A method for detecting the amount of a gas, comprising:
irradiating the gas with electromagnetic radiation using a method according to claim 16, wherein the emitted electromagnetic radiation is associated to a wavelength of maximum absorption of the gas; and
measuring an intensity of the emitted electromagnetic radiation to determine the amount of the gas.

18. The method of claim 17, further comprising momentum matching of the emitted electromagnetic radiation using a matching region immediately adjacent to the second region, wherein an upper surface of the matching region is coplanar with an upper surface of the first region and the second region, and wherein a lower surface of the matching region is coplanar with a lower surface of the first region and the second region.

19. The method of claim 16, further comprising radiation inversion of the emitted electromagnetic radiation using a mirror region immediately adjacent to the first region, wherein an upper surface of the mirror region is coplanar with an upper surface of the first region and the second region, and wherein a lower surface of the mirror region is coplanar with a lower surface of the first region and the second region.

20. A method of manufacturing an emitter configured for emitting electromagnetic radiation, the method comprising:
forming a first region for thermally generating electromagnetic radiation, wherein the first region includes a first photonic crystal of the type having a first periodical structure with first holes having a first dimension and being at a first periodicity, so as to define a first dimension-to-periodicity ratio; and
forming a second region for filtering the electromagnetic radiation generated in the first region, wherein the second region includes a second photonic crystal of the type having a second periodical structure with second holes having a second dimension and being at a second periodicity, so as to define a second dimension-to-periodicity ratio,
wherein the second dimension-to-periodicity ratio is different from the first dimension-to-periodicity ratio, wherein the first region is immediately adjacent to the second region, wherein an upper surface of the first region is coplanar with an upper surface of the second region, and wherein a lower surface of the first region is coplanar with a lower surface of the second region.

* * * * *